(12) United States Patent
Maejima

(10) Patent No.: US 7,539,067 B2
(45) Date of Patent: May 26, 2009

(54) SEMICONDUCTOR INTEGRATED CIRCUIT DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 11/534,097

(22) Filed: Sep. 21, 2006

(65) Prior Publication Data
US 2007/0113021 A1 May 17, 2007

(30) Foreign Application Priority Data
Nov. 11, 2005 (JP) .............................. 2005-327581

(51) Int. Cl.
*G11C 7/10* (2006.01)
(52) U.S. Cl. ......................... 365/189.05; 365/185.22; 365/185.24; 365/189.17; 365/210.12
(58) Field of Classification Search ............ 365/189.05, 365/189.17, 210.12, 185.22, 185.24
See application file for complete search history.

(56) References Cited

U.S. PATENT DOCUMENTS

| | | | | |
|---|---|---|---|---|
| 5,327,392 A | * | 7/1994 | Ohtsuka et al. ........ | 365/233.16 |
| 5,898,621 A | * | 4/1999 | Takahashi et al. ...... | 365/185.33 |
| 6,643,188 B2 | | 11/2003 | Tanaka et al. | |
| 7,310,269 B2 | * | 12/2007 | Shibata ................... | 365/185.17 |
| 2005/0169057 A1 | * | 8/2005 | Shibata et al. .......... | 365/185.28 |

FOREIGN PATENT DOCUMENTS

JP          2003-196988          7/2003

OTHER PUBLICATIONS

Tomoharu Tanaka, et al., "A Quick Intelligent Page-Programming Architecture and a Shielded Bitline Sensing Method for 3 V-Only NAND Flash Memory", IEEE Journal of Solid State Circuits, vol. 29, No. 11, Nov. 1994, pp. 1366-1373.

* cited by examiner

*Primary Examiner*—Pho M. Luu
(74) *Attorney, Agent, or Firm*—Oblon, Spivak, McClelland, Maier & Neustadt, P.C.

(57) ABSTRACT

A semiconductor integrated circuit device includes a data circuit and a group of bit line application voltage terminals to which different voltages are applied. The data circuit holds program data to be programmed into a memory cell and changes the data held according to a verify result from the memory cell. Then, the data circuit selects one of the bit line application voltage terminals based on the data held therein and applies voltage of the selected bit line application voltage terminal to a bit line BLe or BLo.

19 Claims, 15 Drawing Sheets

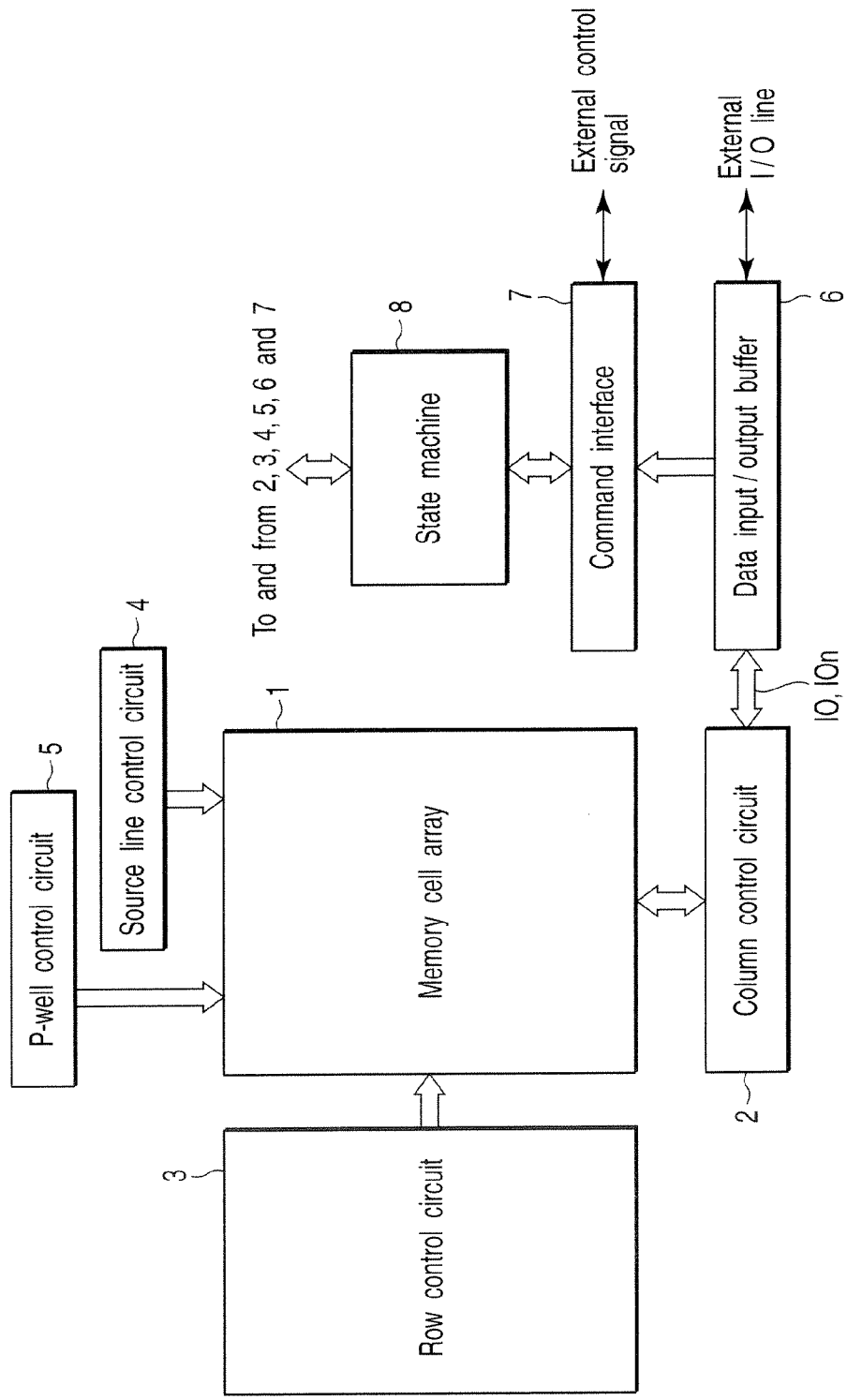
F I G. 1

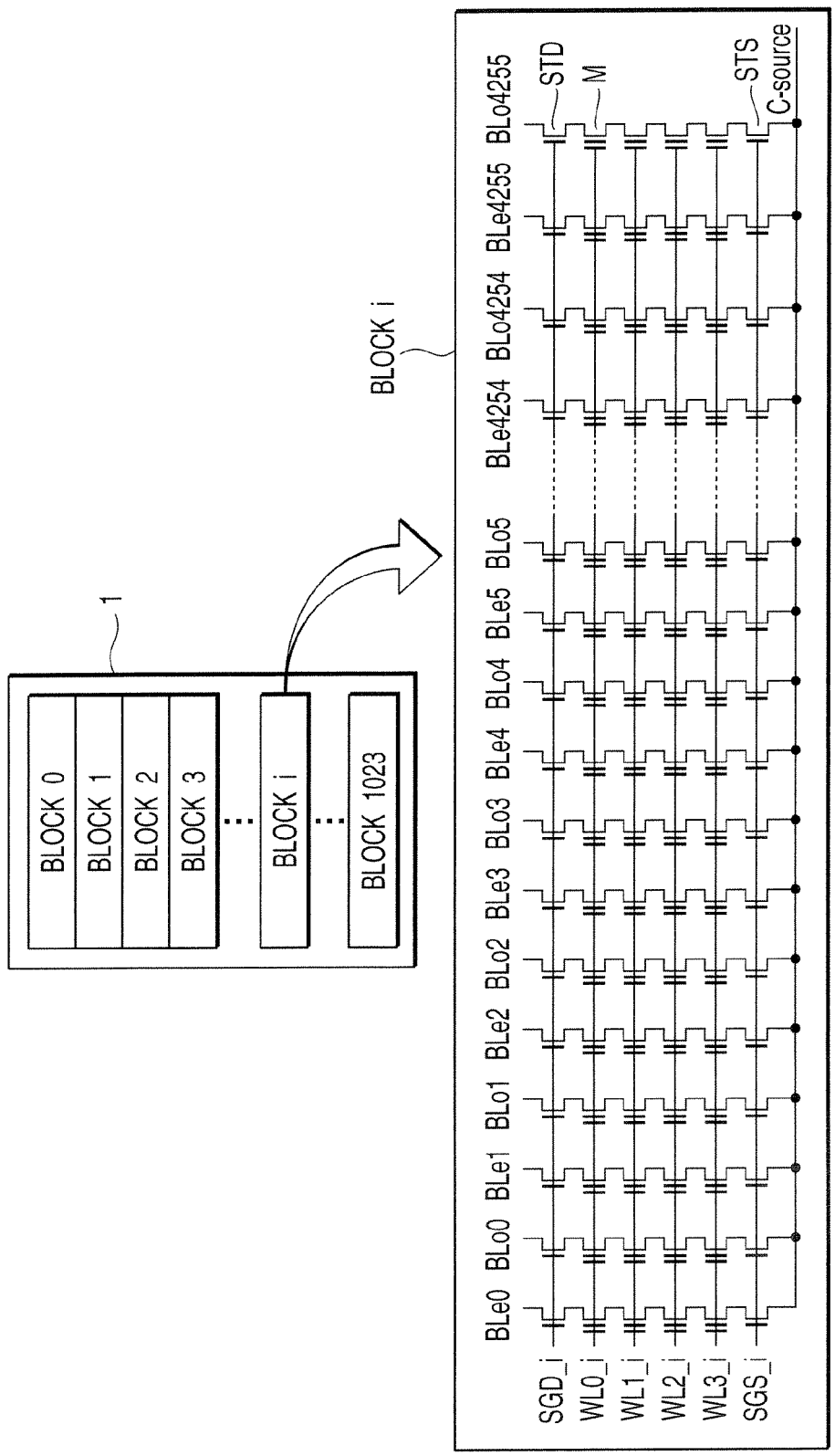
F I G. 2

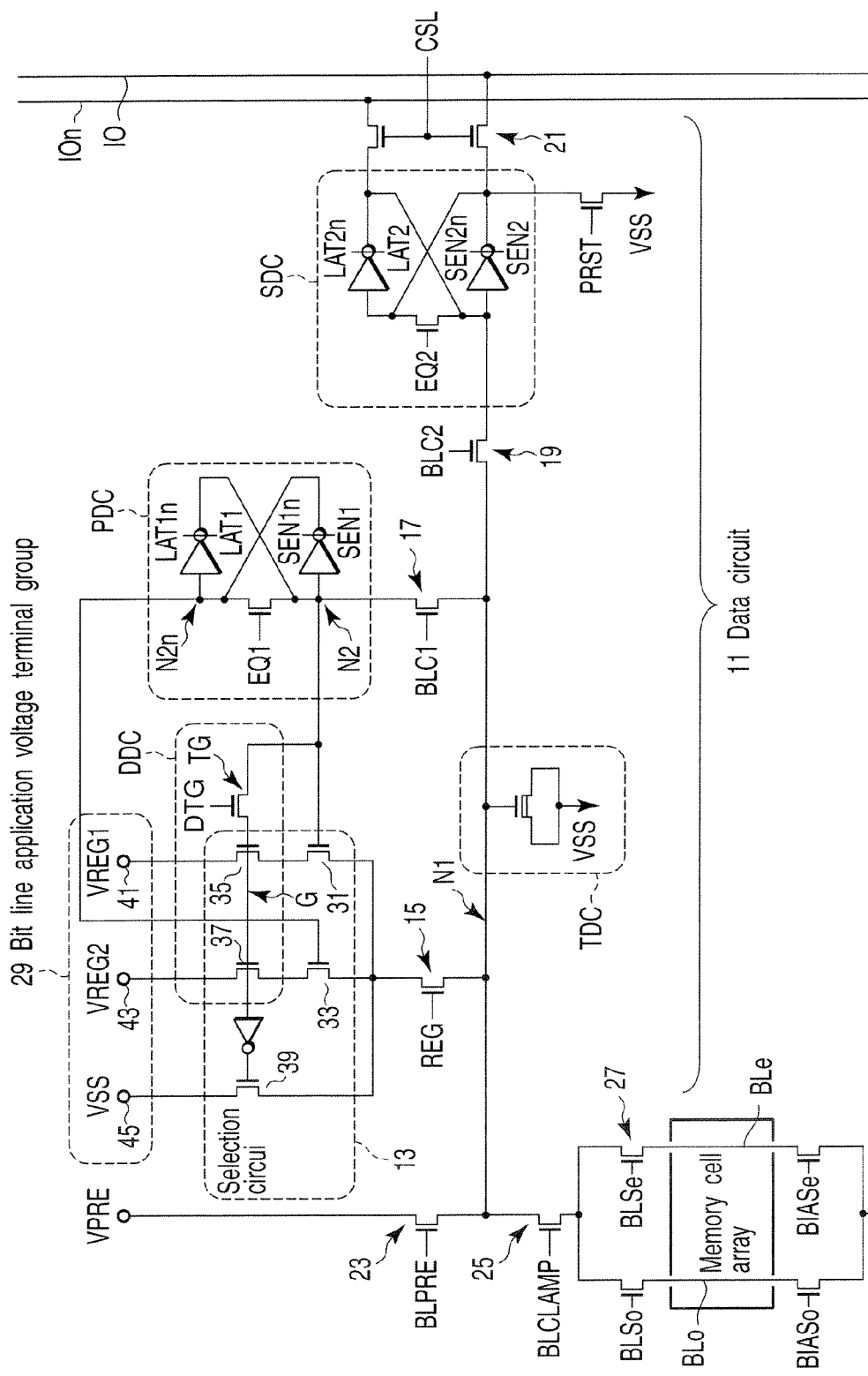
F I G. 6

| DDC(G) | PDC(N2) | Bit line application voltage | |
|---|---|---|---|
| "0" | "0" | VSS(0V) | ← Strong programming |
| "1" | "0" | VREG2(0.5V) | ← Weak programming |
| "1" | "1" | VREG1(2.5V) | ← No programming |

VDD=2.5V

| Memory cell data after writing | "11" | "01" | "10" | "00" |
|---|---|---|---|---|
| DDC | — | — | — | — |
| PDC | — | — | — | — |
| SDC | 0 | — | 1 | — |

← External data load

External data load

FIG. 9A

| Memory cell data after writing | "11" | "01" | "10" | "00" |
|---|---|---|---|---|
| DDC | — | — | — | — |
| PDC | 0 | — | 1 | — |
| SDC | 0 | — | 1 | — |

← Copying from SDC

Copy data of SDC to PDC

FIG. 9B

| Memory cell data after writing | "11" | "01" | "10" | "00" |
|---|---|---|---|---|
| DDC | 0 | — | 1 | — |
| PDC | 0 | — | 1 | — |
| SDC | 0 | — | 1 | — |

← Copying from PDC

Copy data of PDC to DDC

FIG. 9C

| Memory cell data after writing | "11" | "01" | "10" | "00" |
|---|---|---|---|---|
| DDC | 0 | — | 1 | — |
| PDC | 0 | — | 1 | — |
| SDC | 1 | — | 0 | — |

← Inverting and copying data from DDC

Invert and copy data of DDC to SDC

FIG. 9D

Data cache set of logically lower page

| Memory cell data after writing | "11" | "01" | "10" | "00" |
|---|---|---|---|---|
| DDC | 0 | – | 1 | – |
| PDC | 0 | – | 1 | – |
| SDC | 1 | – | 0 | – |

← Copying from PDC

Copy data of PDC to DDC

FIG. 10A

| Memory cell data after writing | "11" | "01" | "10" | "00" |
|---|---|---|---|---|
| DDC | 0 | – | 1 | – |
| PDC | 1 | – | 0 | – |
| SDC | 1 | – | 0 | – |

← Inverting and copying data from DDC

Invert and copy data of DDC to PDC

FIG. 10B

| Memory cell data after writing | "11" | "01" | "10" | "00" |
|---|---|---|---|---|
| DDC | 1 | – | 0 | – |
| PDC | 1 | – | 0 | – |
| SDC | 1 | – | 0 | – |

← Copying from PDC

Copy data of PDC to DDC

FIG. 10C

| Programming state<br>Data state | No programming<br>Data "11" | "L0" programming<br>(1ST Pass) | "L0" programming<br>(2ND Pass) | Completion of "L0" programming<br>Data "L0" |
|---|---|---|---|---|
| DDC | 1 | 0 | Change → 1 | 1 |
| PDC | 1 | 0 | 0 | Change → 1 |
| SDC | 1 | 0 | 0 | 0 |

Values at data cache set time

State of change of data cache at write time of logically lower page data

FIG. 12

| Memory cell data after writing | "11" | "01" | "10" | "00" |
|---|---|---|---|---|
| DDC | – | – | – | – |
| PDC | 0 | 0 | 1 | 1 |
| SDC | 0 | 1 | 0 | 1 |

← Internal data load
← External data load

Internal data load and external data load

FIG. 13A

| Memory cell data after writing | "11" | "01" | "10" | "00" |
|---|---|---|---|---|
| DDC | 0 | 0 | 1 | 1 |
| PDC | 0 | 0 | 1 | 1 |
| SDC | 0 | 1 | 0 | 1 |

← Copying from PDC

Copy data of PDC to DDC

FIG. 13B

| Memory cell data after writing | "11" | "01" | "10" | "00" |
|---|---|---|---|---|
| DDC | 0 | 0 | 1 | 1 |
| PDC | 0 | 1 | 0 | 1 |
| SDC | 0 | 1 | 0 | 1 |

← Copying from SDC

Copy data of SDC to PDC

FIG. 13C

| Memory cell data after writing | "11" | "01" | "10" | "00" |
|---|---|---|---|---|
| DDC | 0 | 0 | 1 | 1 |
| PDC | 0 | 1 | 0 | 1 |
| SDC | 1 | 1 | 0 | 0 |

← Inverting and copying data from DDC

Invert and copy data of DDC to SDC

FIG. 13D

Data cache set of logically upper page

| Memory cell data after writing | "11" | "01" | "10" | "00" |
|---|---|---|---|---|
| DDC | 0 | 1 | 0 | 1 |
| PDC | 0 | 1 | 0 | 1 |
| SDC | 1 | 1 | 0 | 0 |

← Copying from PDC

Copy data of PDC to DDC

FIG. 14A

| Memory cell data after writing | "11" | "01" | "10" | "00" |
|---|---|---|---|---|
| DDC | 0 | 1 | 0 | 1 |
| PDC | 1 | 0 | 1 | 0 |
| SDC | 1 | 1 | 0 | 0 |

← Inverting and copying data from DDC

Invert and copy data of DDC to PDC

FIG. 14B

| Memory cell data after writing | "11" | "01" | "10" | "00" |
|---|---|---|---|---|
| DDC | 1 | 0 | 1 | 0 |
| PDC | 1 | 0 | 1 | 0 |
| SDC | 1 | 1 | 0 | 0 |

← Copying from PDC

Copy data of PDC to DDC

FIG. 14C

| Memory cell data after writing | "11" | "01" | "10" | "00" |
|---|---|---|---|---|
| DDC | 1 | 0 | 1 | 0 |
| PDC | 1 | 0 | 0 | 0 |
| SDC | 1 | 1 | 0 | 0 |

← Indicate logically lower position
← Store combined logic of DDC and SDC
← Indicate logically upper position Combine DDC data and SDC data and store combined data into PDC

FIG. 14D

Data cache set of logically upper page

FIG. 15A

| Programming state | No programming | "01" programming (1ST Pass) | "01" programming (2ND Pass) | Completion of "01" programming |
|---|---|---|---|---|
| Data state | Data "11" | | | Data "01" |
| DDC | 1 | 0 | Change→1 | 1 |
| PDC | 1 | 0 | 0 | Change→1 |
| SDC | 1 | 1 | 1 | 1 |

Values at data cache set time
State of change of data cache at write time of logically upper page data

FIG. 15B

| Programming state | "10" programming | Completion of "10" programming |
|---|---|---|
| Data state | Data "L0" | Data "10" |
| DDC | 1 | 1 |
| PDC | 0 | Change→1 |
| SDC | 0 | 0 |

Values at data cache set time
State of change of data cache at write time of logically upper page data

FIG. 15C

| Programming state | "00" programming (1ST Pass) | "00" programming (2ND Pass) | Completion of "00" programming |
|---|---|---|---|
| Data state | | | Data "00" |
| DDC | 0 | Change→1 | 1 |
| PDC | 0 | 0 | Change→1 |
| SDC | 0 | 0 | 0 |

Values at data cache set time
State of change of data cache at write time of logically upper page data

| DDC(G) | PDC(N2) | Bit line application voltage | |
|---|---|---|---|
| "0" | "0" | VSS(0V) | ← Strong programming |
| "1" | "0" | 0.5V | ← Weak programming |
| "1" | "1" | VDD(2.5V) | ← No programming |

Reference example

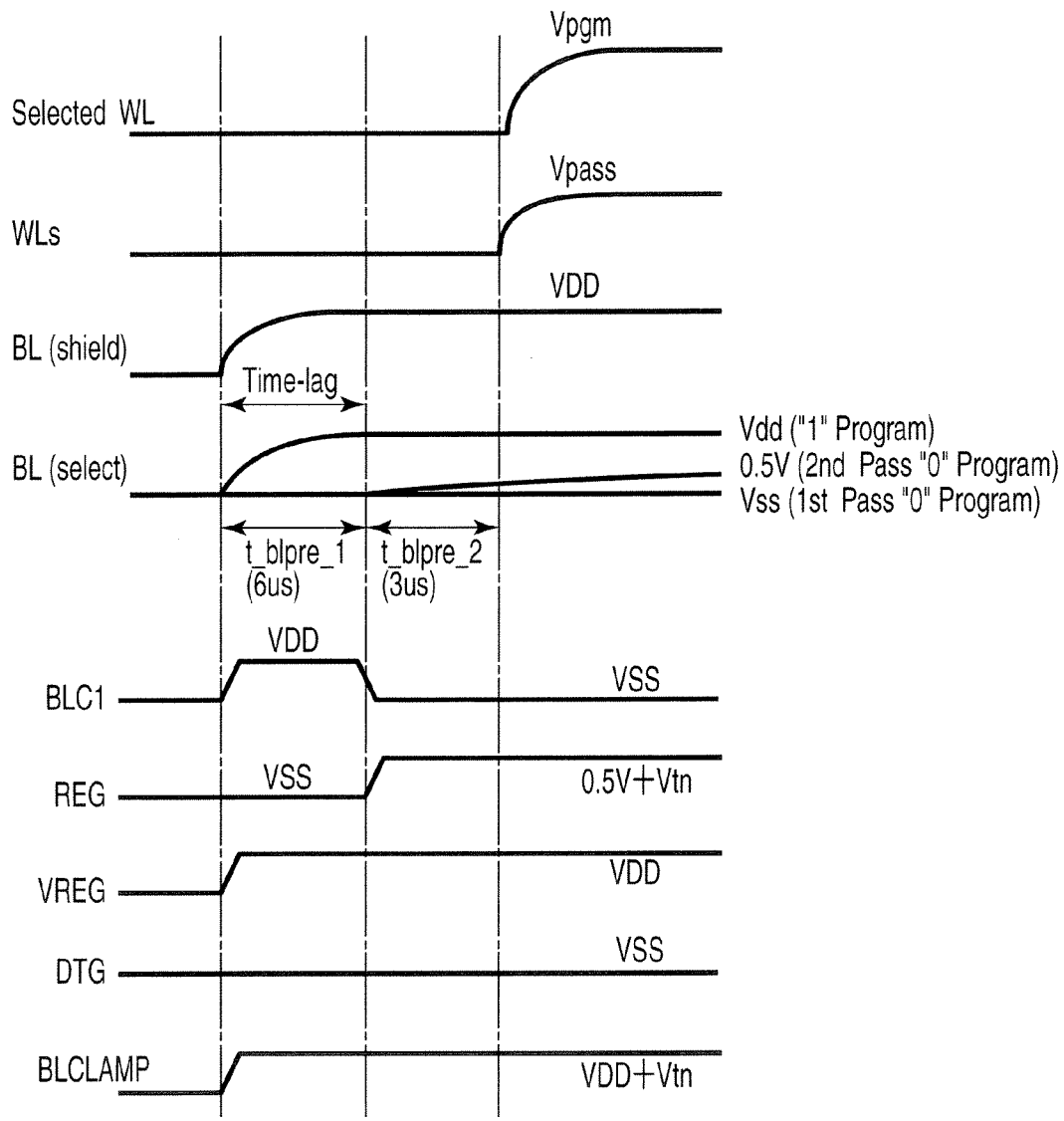
F I G. 18

SEMICONDUCTOR INTEGRATED CIRCUIT DEVICE

CROSS-REFERENCE TO RELATED APPLICATIONS

This application is based upon and claims the benefit of priority from prior Japanese Patent Application. No. 2005-327581, filed Nov. 11, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having an electrically rewritable nonvolatile semiconductor memory.

2. Description of the Related Art

As a method for realizing narrow threshold voltage distribution while enhancing programming speed, a quick-pass write method is known (Jpn. Pat. Appln. KOKAI Publication No. 2003-196988). In the quick-pass write method, voltage applied to a bit line at the programming time is selectively set to one of three values of VDD, 0.5 V and zero.

That is, a voltage of zero is applied to a bit required to be strongly programmed so as to shift the threshold voltage of the memory cell to a large extent. A voltage of 0.5 V is applied to a bit required to be weakly programmed so as to shift the threshold voltage of the memory cell to a small extent. Further, the voltage VDD is applied to a bit which is not required to be programmed. Thus, the programming speed is enhanced and narrow threshold voltage distribution can be realized.

However, in the quick-pass write system, the operation of charging the bit line is performed in two stages of VDD charging and 0.5 V charging. For example, after voltage VDD is applied to a bit line which is to be charged to VDD, a voltage of 0.5 V is applied to a bit line which is to be charged to 0.5 V. Thus, the time required for charging the bit line becomes long.

BRIEF SUMMARY OF THE INVENTION

A semiconductor integrated circuit device according to an aspect of the present invention comprises a bit line to which a memory cell is connected; a group of bit line application voltage terminals to which different voltages are applied; and a data circuit which holds program data to be programmed into the memory cell and changes data to be held according to the verify result from the memory cell; wherein the data circuit selects one of the bit line application voltage terminals based on the data held therein and applies voltage to be applied to the selected bit line application voltage terminal to the bit line.

BRIEF DESCRIPTION OF THE SEVERAL VIEWS OF THE DRAWING

FIG. 1 is a block diagram showing one example of a semiconductor integrated circuit device according to one embodiment of this invention;

FIG. 2 is a diagram showing one example of a memory cell array 1 shown in FIG. 1;

FIG. 6 is a circuit diagram showing one example of a data circuit 11;

FIGS. 9A to 9D are diagrams showing examples of the states of data cache sets;

FIGS. 10A to 10C are diagrams showing examples of the states of data cache sets;

FIG. 12 is a diagram showing one example of the state of a change of a data cache at the time of programming logically lower page data;

FIGS. 13A to 13D are diagrams showing examples of the states of data cache sets;

FIGS. 14A to 14D are diagrams showing examples of the states of data cache sets;

FIGS. 15A to 15C are diagrams each showing one example of the state of a change of a data cache at the time of programming logically upper page data;

FIG. 18 is an operation waveform diagram showing the operation of a semiconductor integrated circuit device according to the reference example.

DETAILED DESCRIPTION OF THE INVENTION

Figure 3:
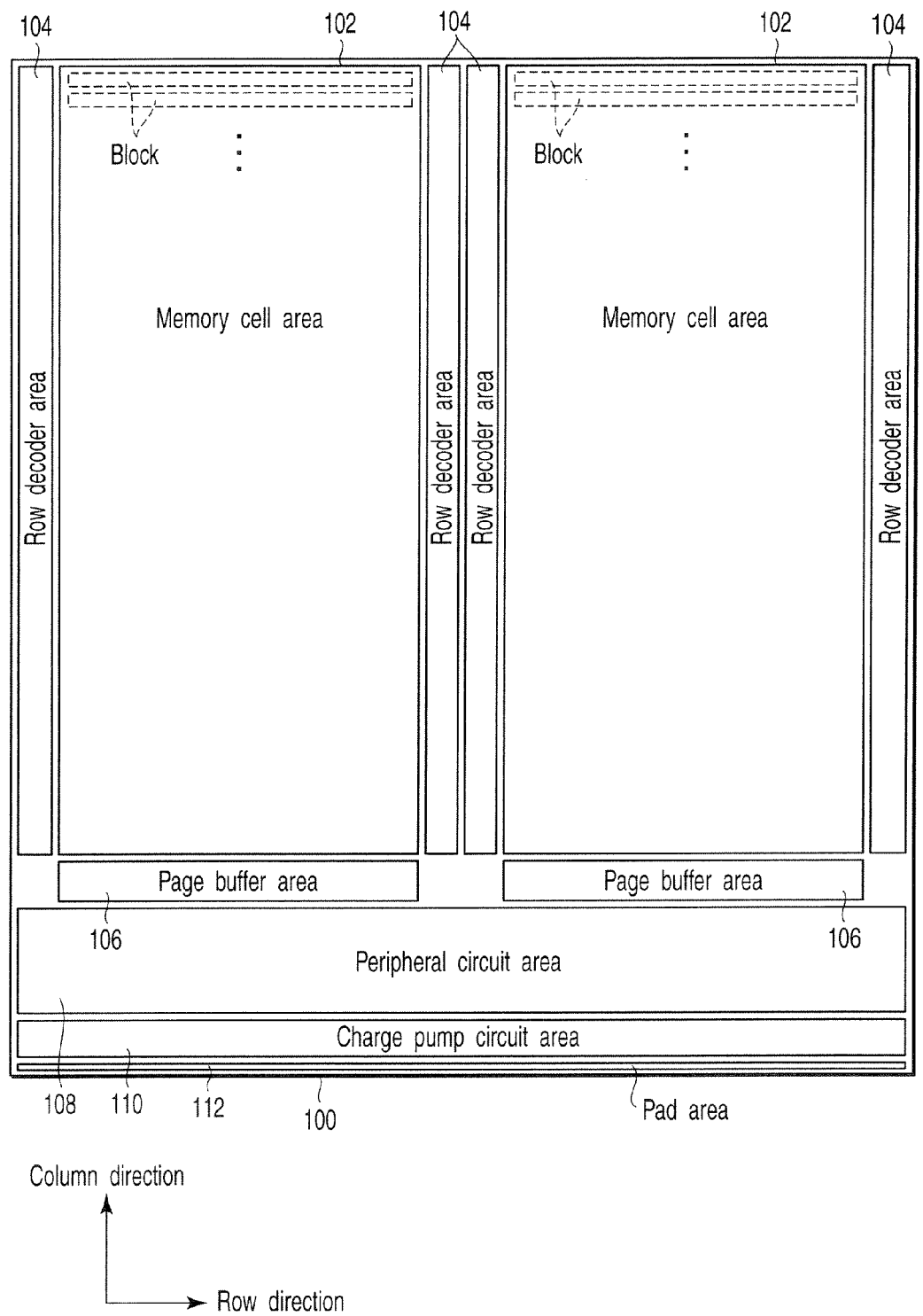
FIG. 3 is a plan view showing one example of a chip layout.

There will now be described an embodiment of this invention with reference to the accompanying drawings. In this explanation, common reference symbols are attached to like portions throughout the drawings.

FIG. 1 is a block diagram showing one example of a semiconductor integrated circuit device according to one embodiment of this invention. The present embodiment shows a NAND flash memory as one example of the semiconductor integrated circuit device, but this invention can also be applied to a memory other than the NAND flash memory.

In a memory cell array 1, nonvolatile semiconductor memory cells are arranged in matrix form. One example of the nonvolatile semiconductor memory cell is a flash memory cell.

A column control circuit 2 controls bit lines of the memory cell array 1 to perform the operation of erasing data in the memory cell, writing data into the memory cell and reading out data from the memory cell. The column control circuit 2 is arranged adjacent to the memory cell array 1.

A row control circuit 3 selects one of the word lines of the memory cell array 1 and selectively applies potentials required for erasing, writing and readout to the selected word line.

A source line control circuit 4 controls the source lines of the memory cell array 1.

A P-well control circuit 5 controls the potential of a P-type cell well in which the memory cell array 1 is formed.

A data input/output buffer 6 is electrically connected to the column control circuit 2 via an IO line pair IO, IOn and electrically connected to an external host (not shown) via an external I/O line. In the data input/output buffer 6, for example, an input/output buffer circuit is arranged. The data input/output buffer 6 receives write data, outputs readout data and receives address data and command data. The data input/output buffer 6 transfers received write data to the column control circuit 2 via the IO line pair IO, IOn and receives readout data from the column control circuit 2 via the IO line pair IO, IOn. Further, it transfers address data input from the exterior in order to select an address of the memory cell array 1 to the column control circuit 2 and row control circuit 3 via a state machine 8. Also, it transfers command data from the external host to a command interface 7.

The command interface 7 receives a control signal from the external host via an external control signal line and determines whether data input to the data input/output buffer 6 is write data, command data or address data. If the input data is command data, it transfers the input data to the state machine 8 as command data.

The state machine 8 manages the whole portion of the flash memory. It receives command data from the external host and performs the data readout, writing, erasing and input/output management.

FIG. 2 is a diagram showing one example of the memory cell array 1 shown in FIG. 1.

As shown in FIG. 2, the memory cell array 1 is divided into a plurality of blocks, for example, 1024 blocks BLOCK0 to BLOCK1023. The block is a minimum unit for erasing. Each block BLOCKi includes a plurality of NAND memory units, for example, 8512 NAND memory units. In this example, each NAND memory unit includes two selection transistors STD, STS and a plurality of memory cells M (in this example, four memory cells) serially connected between the two selection transistors. One end of the NAND memory unit is connected to a bit line BL via the selection transistor STD whose gate is connected to a selection gate line SGD and the other end thereof is connected to a common source line C-source via the selection transistor STS whose gate is connected to a selection gate line SGS. The gate of each memory cell M is connected to a corresponding one of word lines WL. Even-numbered bit lines BLe and odd-numbered bit lines BLo counted from "0" are independently subjected to the data writing and readout operations. The data writing and readout operations are simultaneously performed for the 4256 memory cells connected to the bit lines BLe, for example, among the 8512 memory cells connected to one word line WL. One-bit data is stored in each memory cell M and one-bit data items of the 4256 memory cells are collected to configure one unit of page. For example, each page is a minimum unit for readout. When each memory cell M stores 2-bit data, the 4256 memory cells store data of two pages. Likewise, the 4256 memory cells connected to the bit lines BLo configure a different two pages and the data writing and readout operations are simultaneously performed for the memory cells in the page.

FIG. 3 is a plan view showing one example of a chip layout.

As shown in FIG. 3, memory cell array areas 102, row decoder areas 104, page buffer areas 106, peripheral circuit area 108, charge pump circuit area 110 and pad area 112 are provided on a semiconductor chip 100.

In this example, two memory cell array areas 102 are provided and the memory cell array 1 is provided in each memory cell array area.

The row decoder areas 104 are arranged on both sides of the memory cell array areas 102 in the row direction and the row control circuit 3 is laid out in each row decoder area.

The page buffer areas 106, peripheral circuit area 108, charge pump circuit area 110 and pad area 112 are sequentially arranged on one end portion of the semiconductor chip 100 in the column direction.

In the page buffer area 106, a column control circuit, for example, a page buffer is laid out. The page buffer is one type of a data circuit. It temporarily stores data to be written into the memory cell array 1, for example, write data of one page and temporarily stores data read out from the memory cell array 1, for example, readout data of one page.

In the peripheral circuit area 108, the column-series control circuit 2, data input/output buffer 6, command interface 7 and state machine 8 are laid out.

In the charge pump circuit area 110, a charge pump circuit is laid out. The charge pump circuit is one type of a booster circuit and generates the power supply potential required for writing and erasing, for example, potential higher than the external power supply potential or in-chip power supply potential used in the chip.

In this example, one pad area 112 is provided and arranged on one side of the chip. In the pad area 112, pads are laid out. The pads are connection nodes between the semiconductor chip 100 and the exterior. For example, the pads are connected to the data input/output buffer 6 and command interface 7.

(Distribution of Threshold Voltage Vth)

Figure 4:
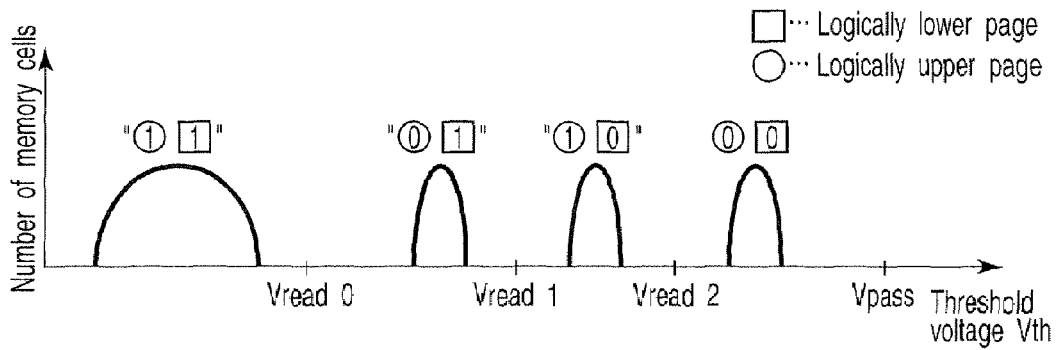
FIG. 4 is a diagram showing the distribution of threshold voltages of memory cells of a four-value storing NAND flash memory.

FIG. 4 is a diagram showing one example of the distribution of threshold voltages Vth of memory cells of a multilevel storing NAND flash memory. In this example, a four-level storing memory is shown.

As shown in FIG. 4, each memory cell stores 2-bit data (4-level data). In this example, 2-bit data items are set to "11", "01", "10", "00" in the order in which the lower threshold voltage Vth increases. One bit and the other bit of the 2-bit data are stored as logically lower page data (indicated by □) and logically upper page data (indicated o) into the same memory.

The 2-bit data "11" indicates the erase state. The memory cell set in the erase state has negative threshold voltage Vth.

The 2-bit data items "01", "10", "00" indicate the write state. The memory cell set in the write state has positive threshold voltage Vth.

Thus, the 2-bit data has logically lower page data and logically upper page data. The 2-bit data is written into the memory cell by performing the write operation twice (the write operation of logically lower page data and the write operation of logically upper page data).

(Quick-Pass Write System)

Next, the quick-pass write system is explained.

Figure 5A:
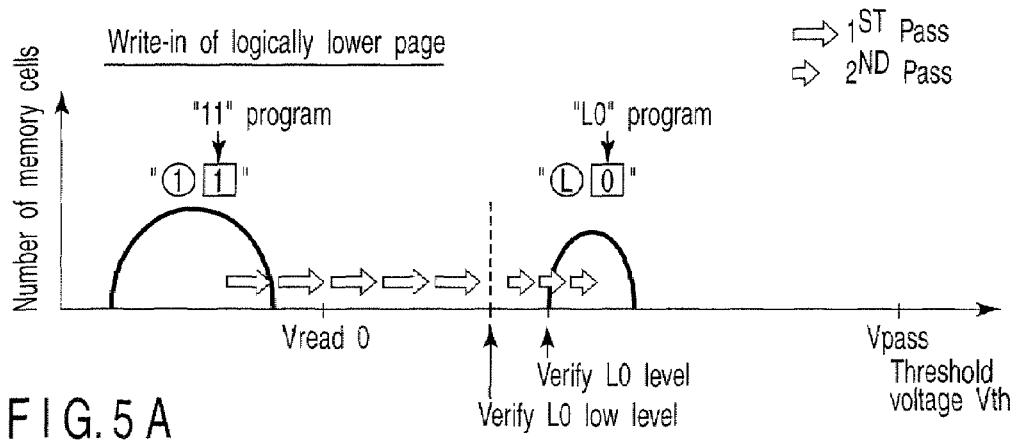
FIGS. 5A and 5B are diagrams showing changes in the distribution of threshold voltages.
Figure 5B:
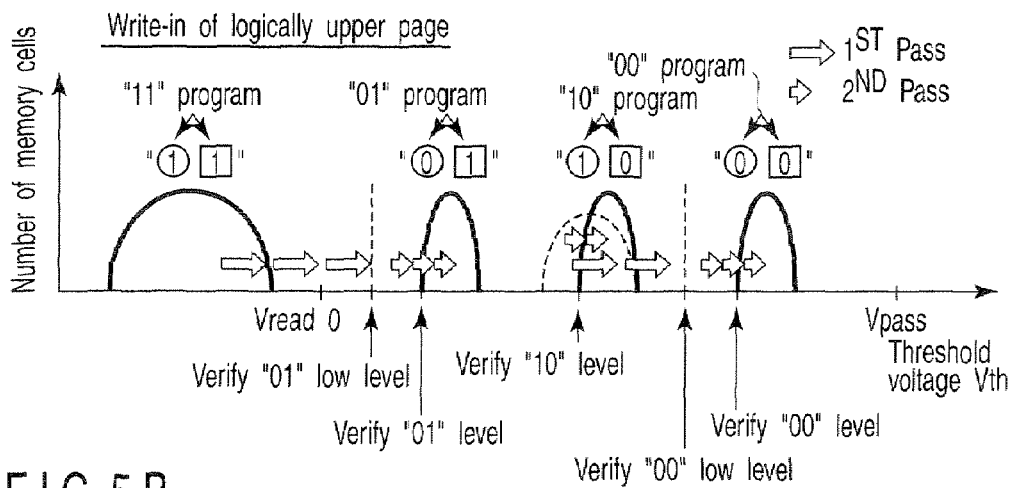

FIG. 5A is a diagram showing a change in the distribution of threshold voltage Vth in the logically lower page data write operation and FIG. 5B is a diagram showing a change in the distribution of threshold voltage Vth in the logically upper page data write operation.

<Write Operation of Logically Lower Page Data>

First, the threshold voltages Vth of all of the memory cells are set in the erase state, that is, in the "11" state. Then, if the logically lower page data is written into the memory cell, the distribution of the threshold voltages Vth is divided into two level of "11" and "L0" according to whether the write data is "1" or "0" as shown in FIG. 5A.

<Write Operation of Logically Lower Page Data "1">

When the logically lower page data is "1", the threshold voltage Vth is not shifted. In one example of this case, the bit line potential is made high (in-chip power supply potential VDD, for example, 2.5 V). Then, no high electric field is applied to the tunnel oxide film of the memory cell and a rise in the threshold voltage Vth is suppressed. As a result, the threshold voltage Vth of the memory cell maintains the erase state ("11" state).

<Write Operation of Logically Lower Page Data "0">

When the logically lower page data is "0", the threshold voltage Vth is shifted. One example of this case is attained by setting the bit line potential to different potentials according to two write stages of $1^{ST}$ Pass and $2^{ND}$ Pass.

(1) $1^{ST}$ Pass

The bit line potential is made low (in-chip ground potential VSS, for example, 0 V) with respect to a memory cell whose threshold voltage Vth is lower than "Verify L0 Low Level" shown in FIG. 5A, that is, a memory cell which is subjected to $1^{ST}$ Pass. A high electric field is applied to the tunnel oxide film, charges are injected into the floating gate and the threshold voltage Vth rises.

(2) $2^{ND}$ Pass

The bit line potential is set to potential higher than potential set in the case of $1^{ST}$ Pass, for example, 0.5 V with respect to a memory cell whose threshold voltage Vth lies between "Verify L0 Low Level" and "Verify L0 Level" shown in FIG. 5A, that is, a memory cell which is subjected to $2^{ND}$ Pass. An electric field which is weaker than that in the case of $1^{ST}$ Pass is applied to the tunnel oxide film and the threshold voltage Vth is raised by an amount smaller than that in the case of $1^{ST}$ Pass.

<Write Operation of Logically Upper Page Data>

Next, if the logically upper page data is written into the memory cell, the distribution of the threshold voltages Vth is divided into four values of "11", "01", "10" and "00" according to whether the write data is "1" or "0" as shown in FIG. 5B.

<Write Operation of Logically Upper Page Data "1">

When the logically upper page data is "1", the threshold voltage Vth is not shifted. Like the case of the write operation of logically lower page data "1", one example of this case is attained by setting the bit line potential to VDD, for example.

<Write Operation of Logically Upper Page Data "0">

When the logically upper page data is "0", the threshold voltage Vth is shifted. Like the case of the write operation of logically lower page data "0", one example of this case is attained by setting the bit line potential to different potentials according to two write stages of $1^{ST}$ Pass and $2^{ND}$ Pass.

(1) $1^{ST}$ Pass

Like the case of $1^{ST}$ Pass of the logically lower page data, the bit line potential is set to, for example, VSS with respect to a memory cell whose threshold voltage Vth is lower than "Verify 01 Low Level" shown in FIG. 5B and a memory cell whose threshold voltage is lower than "Verify 00 Low Level".

(2) $2^{ND}$ Pass

Like the case of $2^{ND}$ Pass of the logically lower page data, the bit line potential is set to, for example, 0.5 V with respect to a memory cell whose threshold voltage Vth lies between "Verify 00 Low Level" and "Verify 00 Level" and a memory cell whose threshold voltage Vth lies between "Verify 01 Low Level" and "Verify 01 Level" shown in FIG. 5B.

In this example, the threshold voltage Vth is shifted from "L0" to "10". In this case, the bit line potential may be set to 0.5 V, for example, with respect to a memory cell whose threshold voltage Vth is lower than "Verify 10 Level" shown in FIG. 5B.

Thus, in the quick-pass write system, the shifting amount of the threshold voltage for each write operation is set large (strongly programmed) until the "Verify L0 Low Level", "Verify 01 Low Level" and "Verify 00 Low Level" are reached in the memory cell into which data "0" is written. After this, the shifting amount of the threshold voltage for each write operation is set small (weakly programmed) until the "Verify L0 Level", "Verify 01 Level" and "Verify 00 Level" are exceeded.

Potential applied to the bit line is controlled by a data circuit (for example, page buffer) connected to the bit line.

(Data Circuit)

FIG. 6 is a circuit diagram showing one example of a data circuit provided in the semiconductor integrated circuit device according to the present embodiment. In this example, the data circuit is configured to cope with a four-level storing process.

As shown in FIG. 6, a data circuit 11 includes a plurality of data cache circuits (dynamic data cache [DDC], primary data cache [PDC], secondary data cache [SDC] and temporary data cache [TDC]) and a selection circuit 13.

The data cache circuit DDC is connected to the selection circuit 13. The selection circuit 13 is connected to a node N1 via a data transfer circuit 15. The data cache circuit PDC is connected to the data cache circuit DDC and selection circuit 13 and connected to the node N1 via a data transfer circuit 17. The data cache circuit SDC is connected to the node N1 via a data transfer circuit 19 and connected to an IO line pair IO, IOn via a column selection circuit 21. The node N1 is connected to a bit line precharge circuit 23 and is further connected to bit lines BLe, BLo via a bit line clamp circuit 25 and bit line selection circuit 27. The data cache circuit TDC is connected to the node N1.

The data cache circuit TDC is a circuit which is temporarily holds data transferred to the node N1. For example, the data cache circuit TDC temporarily holds data transferred to the node N1 via the bit line BLo or BLe from a memory cell (not shown), or data transferred from the other data cache circuits PDC, SDC and data transferred from the data cache circuit DDC via the selection circuit 13.

The data cache circuit SDC holds readout data read out from the memory cell via the node N1 at the readout operation time. Further, it holds write data transferred from the IO line pair IO, IOn at the write operation time. The data cache circuit SDC of this example is a static data cache circuit. One example of the static data cache circuit is a latch circuit having two clocked inverter circuits cross-coupled with each other.

Figures 7, 8:
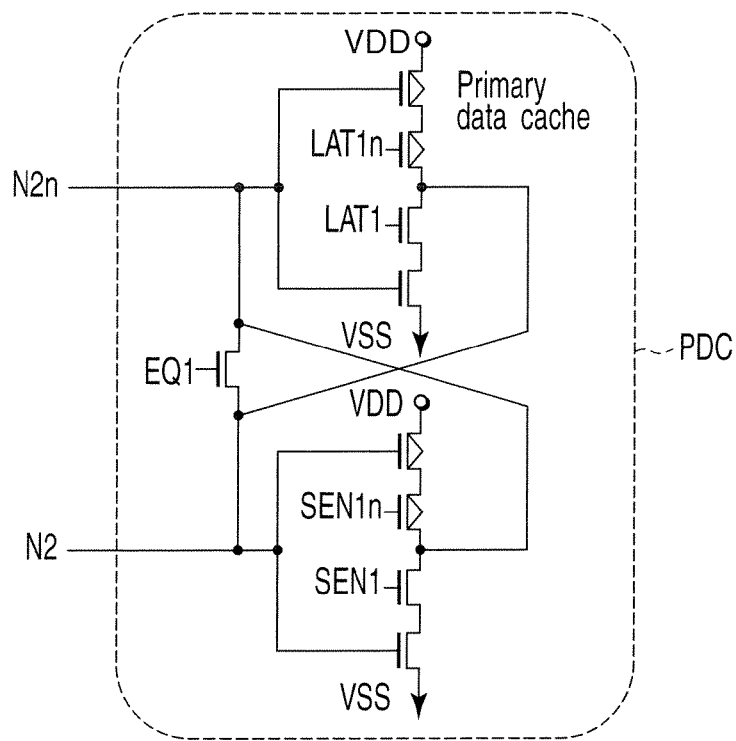
FIG. 7 is a circuit diagram showing one example of a data cache circuit PDC.
FIG. 8 is a diagram showing states in which the data cache circuits PDC, DDC control a selection circuit 13.

The data cache circuit PDC performs the control operation to determine whether the memory cell is programmed or not. In this example, write data is held at the write operation time, and if data held is "1", the memory cell is not programmed. On the other hand, if data held is "0", the memory cell is programmed. Further, when data "0" is held, the data cache circuit PDC changes the held data according to verify readout data read out from the memory cell. If the held data is changed from "0" to "1", the memory cell is not programmed. That is, the program operation is completed. The data cache circuit PDC of this example is a static data cache circuit and has a positive-phase input/output terminal and reversed-phase input/output terminal. One example of the latch circuit is a latch circuit having two clocked inverter circuits cross-coupled with each other. One example of the circuit is shown in FIG. 7.

When four-level data is stored into the memory cell, the data cache circuit PDC of this example holds readout data read out from the memory cell via the node N1 at the time of writing data into the logically upper page.

The data cache circuit DDC controls the degree of strength with which data is programmed into the memory cell. In this example, write data is held at the write operation time, and if the data held is "0", the memory cell is strongly programmed ($1^{ST}$ Pass). On the other hand, if the data held is "1", the memory cell is weakly programmed ($2^{ND}$ Pass). Further, when data "0" is held, the data cache circuit DDC changes held data according to verify readout data read out from the memory cell. If the held data is changed from "0" to "1", the operation mode is changed from the operation of strongly programming the memory cell to the operation of weakly programming the memory cell. That is, the $1^{ST}$ Pass is changed to the $2^{ND}$ Pass. The data cache circuit DDC of this example is a dynamic data cache circuit. One example of the dynamic data cache circuit is a dynamic data holding circuit which includes a gate wiring G and a gate circuit TG which controls the conductive or nonconductive state of the gate wiring G. For example, the gate circuit TG is connected between the positive-phase input/output terminal N2 of the data cache circuit PDC and the gate wiring G. The gate circuit TG is controlled by a control signal DTG. The gate circuit TG makes the gate wiring G conductive to transfer data of the positive-phase input/output terminal N2 to the gate wiring G and then makes the gate wiring G nonconductive to confine the transferred data in the gate wiring G. Thus, data is held in the wiring capacitor of the gate wiring G. Further, the data cache circuit DDC of this example raises the voltage of a bit line application voltage terminal group 29 with the data kept confined in the gate wiring G. Then, the potential of the data confined in the gate wiring G is raised by the capacitive coupling. This is a so-called bootstrap circuit. Thus, the selection circuit 13 makes it possible to transfer the bit line voltage without causing a voltage drop corresponding to the threshold voltage of an N-channel transistor, for example.

The bit line application voltage terminal group 29 includes a plurality of bit line application voltage terminals and different voltages are applied to the respective bit line application voltage terminals. The different voltages correspond to states in which the strength of programming the memory cell is divided by stages. In this example, three voltages of VSS, VREG2 and VREG1 are provided, for example. The three voltages correspond to the state of VSS in which the memory cell is strongly programmed, the state of VREG2 in which the memory cell is weakly programmed and the state of VREG1 in which the memory cell is not programmed. One example of the voltages is VSS=0 V, VREG2=0.5 V and VREG1=2.5 V. The values of the voltages are not limited to 0 V, 0.5 V and 2.5 V and can be adequately changed.

The selection circuit 13 selects one of the voltages VSS, VREG2, VREG1 of the bit line application voltage terminal group based on the control operation by the data cache circuits PDC, DDC and supplies the selected voltage to a corresponding one of the bit lines BLe, BLo. In this example, the voltage is supplied via the node N1, bit line clamp circuit 25 and bit line selection circuit 27.

The selection circuit 13 of this example includes first to fifth gates 31, 33, 35, 37 and 39. The first gate 31 selects a terminal 41 among the bit line application voltage terminal group to which the voltage VREG1 is applied. The second gate 33 selects a terminal 43 to which the voltage VREG2 is applied. The third gate 35 is provided between the first gate 31 and the terminal 41. The fourth gate 37 is provided between the second gate 33 and the terminal 43. The fifth gate 39 selects a terminal 45 to which the voltage VSS is applied.

The first and second gates 31, 33 are controlled by data held by the data cache circuit PDC. The third to fifth gates 35, 37 and 39 are controlled by data held by the data cache circuit DDC. The first to fifth gates 31, 33, 35, 37 and 39 of this example are N-channel MOSFETs. The first gate 31 is controlled by the potential of the positive-phase input/output terminal N2 of the data cache circuit PDC and the second gate 33 is controlled by the potential of the reversed-phase input/output terminal N2n of the data cache circuit PDC. The third and fourth gates 35, 37 are controlled by the potential of the gate wiring G of the data cache circuit DDC and the fifth gate 39 is controlled by potential of the reversed phase with respect to the potential of the gate wiring G of the data cache circuit DDC. The state in which the data cache circuits PDC, DDC control the selection circuit 13 is shown in FIG. 8.

(One Example of Operation of Data Circuit)

Next, one example of the operation of the data circuit 11 is explained. In this example, the operation other than the write operation may be the same as the operation conventionally known. Therefore, in this specification, only the write operation is explained.

One example of the operation is an example in which a quick-pass write operation is performed in the case of four-level storage. The write operation is performed in an order of the data cache set of the logically lower page, write-in of the logically lower page data, data cache set of the logically upper page and write-in of the logically upper page data.

<Data Cache Set of Logically Lower Page>

First, logically lower page data to be written is stored in the data cache circuit SDC via the IO line pair IO, IOn before writing the logically lower page data. In this specification, this operation is called external data load.

After the external data load, data storage into the data cache circuits DDC, PDC, SDC called data cache set is performed. One example of data storage is shown in FIGS. 9A to 9D and 10A to 10C and the explanation for the flow of the data cache set is omitted.

The logically upper page data is written into the memory cell after the data cache set.

<Write-in of Logically Lower Page Data>

When "0" is stored in the data cache circuit DDC at the data cache set time, a strong programming operation is performed. On the other hand, when "1" is stored, a weak programming operation is performed or the programming operation is not performed.

In this example, when "0" is stored in the data cache circuit DDC, the potential of the gate wiring G shown in FIG. 6 is made low, for example, ground potential VSS (for example, 0 V) and set into an electrically floating state. The third and fourth gates 35, 37 are set in the nonconductive state to inhibit transfer of the voltages VREG1, VREG2. At the same time, the fifth gate 39 is set into the conductive state to permit transfer of the voltage VSS. Therefore, a state in which the strong programming operation can be performed is set.

On the other hand, when "1" is stored in the data cache circuit DDC, the potential of the gate wiring G shown in FIG. 6 is made high, for example, power supply potential VDD (for example, 2.5 V) and set into an electrically floating state. The third and fourth gates 35, 37 are set in the conductive state to permit transfer of the voltages VREG1, VREG2. At the same time, the fifth gate 39 is set into the nonconductive state to inhibit transfer of the voltage VSS. Therefore, a state in which the weak programming operation can be performed or no programming operation may be performed is set.

At the data cache set time, the programming operation is performed if "0" is stored in the data cache circuit PDC and the programming operation is not performed if "1" is stored.

In this example, if "0" is stored in the data cache circuit PDC, the potential of the positive-phase input/output terminal N2 shown in FIG. 6 is made low, for example, ground potential VSS (for example, 0 V) and the potential of the reversed-phase input/output terminal N2n is made high, for example, power supply potential VDD (for example, 2.5 V). The first gate 31 is set in the nonconductive state to inhibit transfer of the voltage VREG1. At the same time, the second gate 33 is set into the conductive state to permit transfer of the voltage VREG2. Therefore, a programmable state (in this example, a state in which the weak programming operation can be performed) is set.

On the other hand, if "1" is stored in the data cache circuit PDC, the potential of the positive-phase input/output terminal N2 shown in FIG. 6 is made high, for example, power supply potential VDD (for example, 2.5 V). The first gate 31 is set in the conductive state to permit transfer of the voltage VREG1. At the same time, the second gate 33 is set into the nonconductive state to inhibit transfer of the voltage VREG2. Therefore, a state in which it is possible not to perform the programming operation is set.

Thus, the data cache circuits DDC, PDC set the selection state by the first to fifth gates 31, 33, 35, 37 and 39 of the selection circuit 13.

Figure 11:
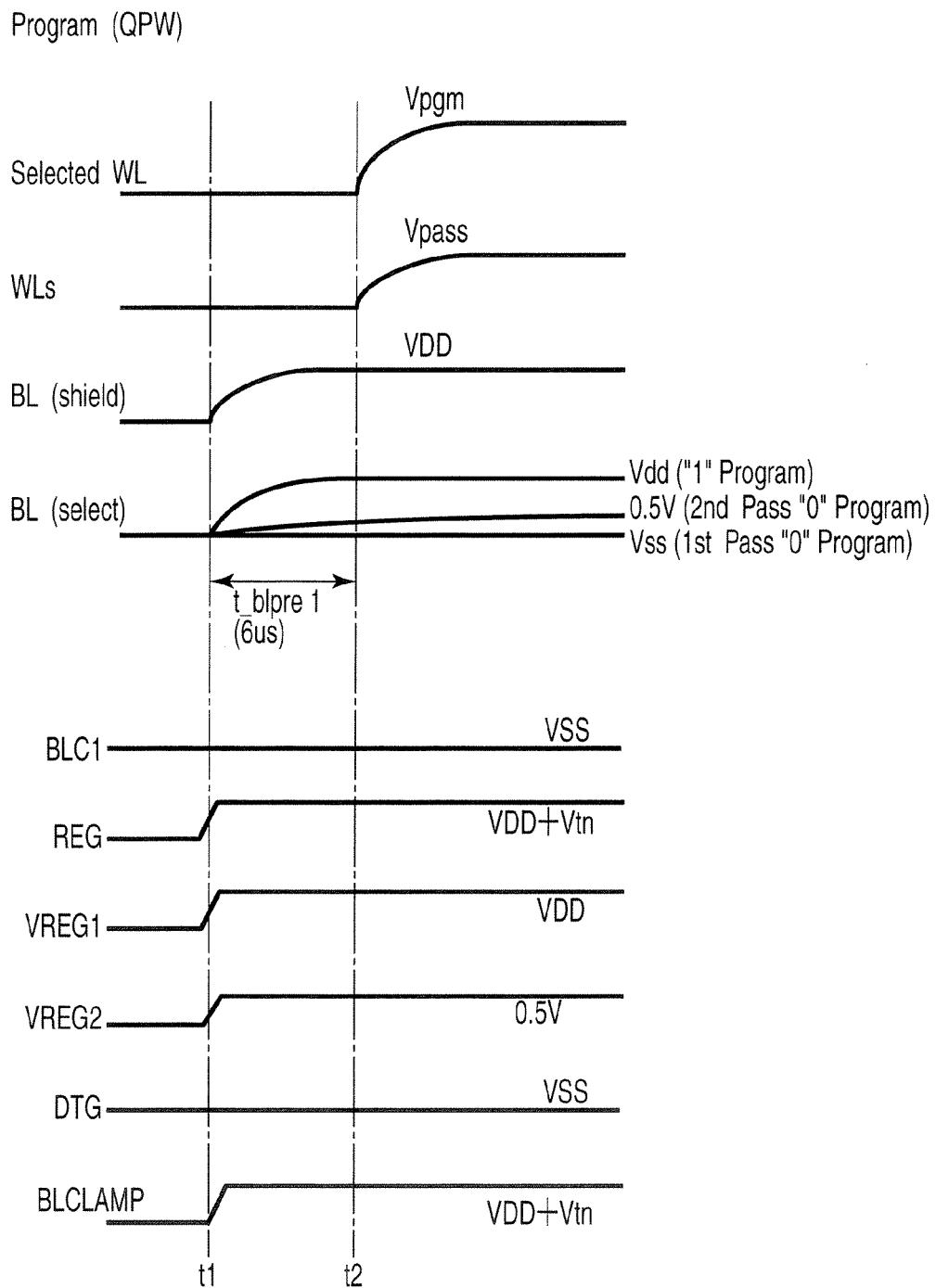
FIG. 11 is a waveform diagram showing one example of the operation of the semiconductor integrated circuit device according to one embodiment of this invention.

FIG. 11 is a waveform diagram showing one example of the operation of the semiconductor integrated circuit device according to one embodiment of this invention.

After the selection state of the selection circuit 13 is determined, the voltages VREG1, VREG2 are raised at time t1 as shown in FIG. 11 (in this example, VSS is fixed). Further, a signal REG which controls the transfer circuit 15 and a signal BLCLAMP which controls the bit line clamp circuit 25 are raised to (power supply potential VDD+Vtn) (Vtn is threshold voltage of an N-channel MOSFET). As a result, voltage selected by the selection circuit 13 is applied to the selected bit line BLe or BLo via the data transfer circuit 15, node N1, bit line clamp circuit 25 and bit line selection circuit 27 according as the voltages VREG1, VREG2 are applied to the terminals 41, 43. In FIG. 11, BL (select) is one of the bit lines BLe and BLo which is selected by the bit line selection circuit 27 and BL (shield) is a non-selected bit line.

After the voltage VSS, VREG1, VREG2 is applied to the selected one of the bit lines BLe and BLo, the potential of the selected word line (Selected WL) is set to Vpgm at time t2 and the potential of the non-selected word line (WLs) is set to Vpass. Thus, data "1" or "0" is written into the memory cell arranged at the intersection between the selected word line and the selected bit line.

After this, the verify read operation of "Verify L0 Low Level" and "Verify L0 Level" is performed.

First, the verify read operation of "Verify L0 Low Level" is performed. Precharge potential VPRE from the bit line precharge circuit 23 is applied to the selected bit line. Then, the potential of the selected word line (Selected WL) is set to "Verify L0 Low Level" and the potential of the non-selected word line (WLs) is set to Vpass. If the memory cell is turned off, that is, if the potential of the selected bit line maintains the precharge potential VPRE, for example, it indicates that the writing operation of "Verify L0 Low Level" is completed (Pass). On the other hand, if the memory cell is turned on, that is, if the potential of the selected bit line is lowered from the precharge potential VPRE, for example, it indicates that the writing operation of "Verify L0 Low Level" is not yet completed (Fail).

When "0" is stored in the data cache circuit DDC of this example, it maintains "0" in the case of "Fail" and it changes from "0" to "1" in the case of "Pass" according to the result of verifying operation of "Verify L0 Low Level". When a change from "0" to "1" is made, it indicates completion of $1^{ST}$ Pass and a state in which a weak programming operation can be performed or it is possible not to perform the programming operation is set.

Next, the verify read operation of "Verify L0 Level" is performed. The precharge potential VPRE from the bit line precharge circuit 23 is applied to the selected bit line. Then, the potential of the selected word line (Selected WL) is set to "Verify L0 Level" and the potential of the non-selected word line (WLs) is set to Vpass. Likewise, if the memory cell is turned off, that is, if the potential of the selected bit line maintains the precharge potential VPRE, for example, it indicates that the writing operation of "Verify L0 Level" is completed (Pass). On the other hand, if the memory cell is turned on, that is, if the potential of the selected bit line is lowered from the precharge potential VPRE, for example, it indicates that the writing operation of "Verify L0 Level" is not yet completed (Fail).

When "0" is stored in the data cache circuit PDC of this example, "1" is stored in the case of "Pass" and "0" is stored in the case of "Fail" according to the result of the verify operation of "Verify L0 Level". When a change from "0" to "1" is made, it indicates completion of the programming operation.

While the above write and verify read operations are repeatedly performed with a preset number set as an upper limit, logically lower page data items are written into the memory cells.

The state of a change in the data cache at the write time of logically lower page data is shown in FIG. 12.

<Data Cache Set of Logically Upper Page>

First, logically upper page data to be written is stored in the data cache circuit SDC via the IO line pair IO, IOn before writing the logically upper page data (external data load). Further, the logically lower page data which is already written is read out and stored into the data cache circuit PDC via the node N1. This operation is called internal data load in this specification. After performing the external data load and internal data load, the data cache set is performed. One example of the state of the operations is shown in FIGS. 13A to 13D and 14A to 14D and the explanation for the operations is omitted.

After the data cache set, the logically upper page data is written into the memory cell.

<Write-in of Logically Upper Page Data>

The write-in operation of the logically upper page data is the same as the write-in operation of the logically lower page data.

That is, when "0" is stored in the data cache circuit DDC at the data cache set time, a strong programming operation is performed. On the other hand, when "1" is stored, a weak programming operation is performed or the programming operation is not performed.

Further, when "0" is stored in the data cache circuit DDC at the data cache set time, the programming operation is performed. On the other hand, if "1" is stored, the programming operation is not performed.

Like the write-in operation of the logically lower page data, the selection state of the selection circuit 13 is determined according to data held in the data cache circuits DDC, PDC of this example. The operation waveform obtained after the selection state is determined is the same as that of FIG. 11 and the verify read operation is also the same as the verify read operation of the logically lower page data except that voltage applied to the selected word line is selectively set to "Verify 01 Low Level", "Verify 01 Level", "Verify 10 Level", "Verify 00 Low Level" and "Verify 00 Level".

When "0" is stored in the data cache circuit DDC of this example, "0" is maintained in the case of "Fail" and a change to "1" is made in the case of "Pass" according to the result of the verify operation of "Verify 01 Low Level" or "Verify 00 Low Level". When a change from "0" to "1" is made, a state in which $1^{ST}$ Pass is completed and a weak programming operation can be performed or it is possible not to perform the programming operation is set.

Further, when "0" is stored in the data cache circuit PDC of this example, "1" is stored in the case of "Pass" and "0" is stored in the case of "Fail" according to the result of the verify operation of "Verify 01 Level", "Verify 10 Level" or "Verify 00 Level". When a change from "0" to "1" is made, the programming operation is completed.

While the above write and verify read operations are repeatedly performed with a preset number set as an upper limit, logically upper page data items are written into the memory cells.

The state of a change in the data cache at the write time of logically upper page data is shown in FIGS. 15A to 15C.

Thus, the data circuit 11 of this example selects voltage VSS (strong programming), VREG2 (weak programming) or VREG1 (no programming) to be applied to the bit line by use of the selection circuit 13 and applies the selected voltage to the bit line. The selection state of the selection circuit 13 is controlled by data items held in the data cache circuits PDC, DDC. As a result, particularly, the voltages VREG1 and VREG2 can be applied to the bit line BLe or BLo without causing time lag.

Figures 16, 17:
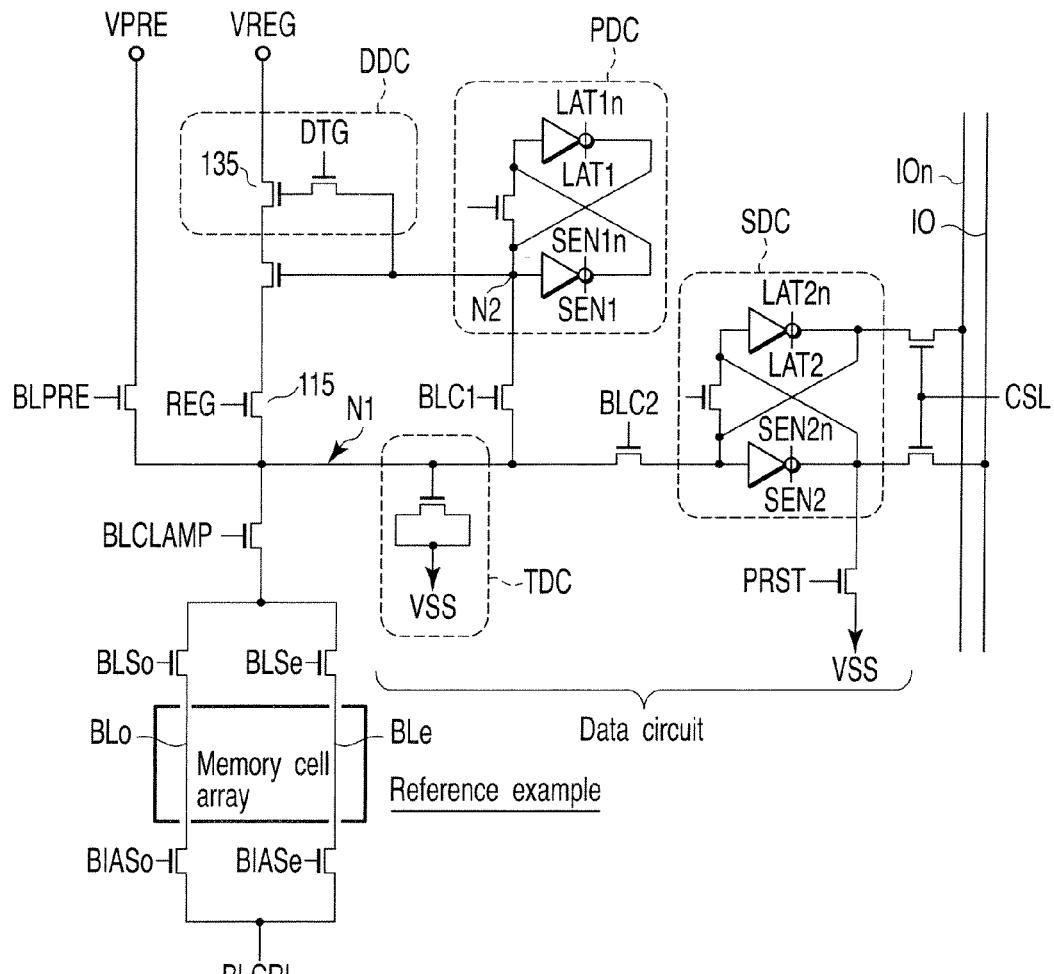
FIG. 16 is a circuit diagram showing a data circuit according to a reference example.
FIG. 17 is a diagram showing the relation between the holding data of the data cache circuits PDC, DDC according to the reference example and bit line application voltage.

A data circuit according to a reference example is shown in FIG. 16. The data circuit according to the reference example is a four-level storing data circuit which can cope with a quick-pass write system.

The data circuit shown in FIG. 16 supplies voltage VSS (strong programming) or VDD (no programming) to the bit line from the data cache circuit PDC at the data write time. The voltages VDD and VSS are supplied from the output of a clocked inverter of the data cache circuit PDC. Further, a voltage of 0.5 V (weak programming) is applied to the bit line by turning on a gate circuit 135 by use of data held in the data cache circuit DDC and limiting the voltage VREG (=VDD) to 0.5 V by use of the gate voltage of a data transfer circuit 115. The relation between holding data items of the data cache circuits PDC, DDC and the bit line application voltage is shown in FIG. 17.

In the reference example, the voltages VSS, VDD are applied to the bit line from the data cache circuit PDC. With this configuration, 0.5 V cannot be applied to the node N1 while the voltages VSS, VDD are applied. This is because there occurs a possibility that data "0" held in the data cache circuit PDC is changed to "1" or "1" is changed to "0" if 0.5 V is applied to the node N1 with the data cache circuit PDC connected to the node N1.

In order to prevent occurrence of the above problem, as shown in the operation waveforms shown in FIG. 18, a signal BLC1 is made high (VDD) to transfer the voltage VSS or VDD from the data cache circuit PDC to the node N1 and then the signal BLC1 is made low (VSS) to cut off the data cache circuit PDC from the node N1. After this, the signal REG is set to (0.5 V+Vn) to transfer 0.5 V to the node N1. Thus, the bit line charging operation is performed by a two-stage charging operation.

However, in the two-stage charging operation, time lag (in this example, 0.6 μs) occurs between the charging process for VDD, VSS and the charging process for 0.5 V, and as a result, it takes a long time to charge the bit line. If a long time is required for the bit line charging operation, a reduction in time required for the write operation is suppressed.

On the other hand, as shown in FIG. 11, the data circuit 11 of this example selects one of the voltages VREG1 (VDD), VREG2 (0.5 V) and VSS by use of the selection circuit 13 to transfer the selected voltage to the node N1 while the signal BLC1 is made low and the data cache circuit PDC is cut off from the node N1. Thus, the bit line charging operation is performed without using a two-stage charging operation and no time lag occurs between the charging process for VREG1 (VDD), VSS and the charging process for VREG2 (0.5 V). Therefore, in the data circuit 11 of this example, the bit line charging operation can be performed in a shorter period of time in comparison with the reference example.

Thus, according to the present embodiment, a semiconductor integrated circuit device having a nonvolatile semiconductor memory which can charge both of a bit which is desired to be strongly programmed and a bit which is desired to be weakly programmed at high speed can be attained. The above semiconductor integrated circuit device is advantageous in reducing time required for the write operation.

Further, the data circuit 11 of this example is advantageous over that of the reference example in that data can be easily programmed. For example, in the reference example, the node N1 to which 0 V is applied is set into an electrically floating state while a voltage of 0.5 V is being applied to the bit line. The potential of 0 V of the node which is set in the electrically floating state is influenced by the potential of an adjacent node N1 and the potential of a further adjacent node N1 and there occurs a possibility that the potential will be raised to potential higher than 0 V which should be originally set. This means that the memory cell which should be strongly programmed is difficult to be programmed.

On the other hand, since the data circuit 11 of this example can simultaneously apply the voltage VREG1 (VDD), VREG2 (0.5 V) and VSS (0 V) to the node N1, the bit line will not be set into the electrically floating state while the above voltages are being applied.

That is, while the different voltages VREG1 (VDD), VREG2 (0.5 V) and VSS (0 V) are being applied to the bit line BLe or BLo from the group of bit line application voltage terminals 41, 43, 45, a corresponding one of the bit lines BLe and BLo is not set into the electrically floating state. Thus, the memory cell which should be strongly programmed can be easily programmed.

According to the present embodiment of this invention, a semiconductor integrated circuit device having a nonvolatile semiconductor memory which can charge both of a bit to which is desired be strongly programmed and a bit which is desired to be weakly programmed at high speed can be provided.

As described above, this invention has been explained by using one embodiment, but this invention is not limited to the present embodiment. Further, the above embodiment is not only one embodiment of this invention. This invention can be variously modified without departing from the technical scope thereof at the time of embodying.

Further, the above embodiment contains inventions of various stages and the inventions of various stages can be extracted by adequately combining a plurality of constituents disclosed in the above embodiment.

In addition, the above embodiment is explained based on the example in which this invention is applied to the NAND flash memory, but this invention is not limited to the NAND flash memory and can be applied to an AND, NOR flash memory or the like other than the NAND flash memory, for example. Further, a semiconductor integrated circuit device containing the above flash memory, for example, a processor, system LSI or the like are also contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a bit line to which a memory cell is connected;
   a group of bit line application voltage terminals to which different voltages are applied; and
   a data circuit configured to hold program data to be programmed into the memory cell and change data to be held according to a verify result from the memory cell, the data circuit is further configured to select one of the bit line application voltage terminals based on the data held therein and apply a voltage to the selected bit line application voltage terminal to the bit line,
   wherein the data circuit includes a first data cache circuit configured to control and determine whether the memory cell is programmed, a second data cache circuit configured to control a strength of programming the memory cell, and a selection circuit configured to select the bit line application voltage terminal, and the selection circuit selects the bit line application voltage terminal based on the control operation by the first and second data cache circuits.

2. The device according to claim 1, wherein the selection state of the selection circuit is determined before voltage is applied to the bit line application voltage terminal, and one of voltages applied to the bit line application voltage terminals is applied to the bit line according as the voltages are sequentially applied to the bit line application voltage terminals.

3. The device according to claim 2, wherein different voltages are simultaneously applied to the bit line application voltage terminals.

4. The device according to claim 3, wherein the bit line is kept prevented from being set into an electrically floating state while different voltages are applied to the bit line from the bit line application voltage terminals.

5. The device according to claim 4, wherein the selection circuit includes a first gate which selects a first bit line application voltage terminal among the bit line application voltage terminal group, a second gate which selects a second bit line application voltage terminal among the bit line application voltage terminal group, a third gate provided between the first gate and the first bit line application voltage terminal, a fourth gate provided between the second gate and the second bit line application voltage terminal, and a fifth gate which selects a third bit line application voltage terminal among the bit line application voltage terminal group, the first data cache circuit has a positive-phase input/output terminal and reversed-phase input/output terminal, the first gate is controlled by potential of the positive-phase input/output terminal, the second gate is controlled by potential of the reversed-phase input/output terminal, the second data cache circuit includes a gate wiring which holds data and a gate circuit which is connected between one end of the gate wiring and the positive-phase input/output terminal and controls a conduction state of a path between the gate wiring and the positive-phase input/output terminal, the third and fourth gates are controlled by potential of the gate wiring, and the fifth gate is controlled by potential having a reversed phase with respect to the potential of the gate wiring.

6. The device according to claim 5, wherein the first data cache circuit is a static data cache and the second data cache circuit is a dynamic data cache.

7. The device according to claim 3, wherein the selection circuit includes a first gate which selects a first bit line application voltage terminal among the bit line application voltage terminal group, a second gate which selects a second bit line application voltage terminal among the bit line application voltage terminal group, a third gate provided between the first gate and the first bit line application voltage terminal, a fourth gate provided between the second gate and the second bit line application voltage terminal, and a fifth gate which selects a third bit line application voltage terminal among the bit line application voltage terminal group, the first data cache circuit has a positive-phase input/output terminal and reversed-phase input/output terminal, the first gate is controlled by potential of the positive-phase input/output terminal, the second gate is controlled by potential of the reversed-phase input/output terminal, the second data cache circuit includes a gate wiring which holds data and a gate circuit which is connected between one end of the gate wiring and the positive-phase input/output terminal and controls a conduction state of a path between the gate wiring and the positive-phase input/output terminal, the third and fourth gates are controlled by potential of the gate wiring, and the fifth gate is controlled by potential having a reversed phase with respect to the potential of the gate wiring.

8. The device according to claim 7, wherein the first data cache circuit is a static data cache and the second data cache circuit is a dynamic data cache.

9. The device according to claim 3, wherein voltages of the bit line application voltage terminal group correspond to a state in which a degree of strength of programming the memory cell is divided by stages.

10. The device according to claim 2, wherein the bit line is kept prevented from being set into an electrically floating state while different voltages are applied to the bit line from the bit line application voltage terminals.

11. The device according to claim 10, wherein the selection circuit includes a first gate which selects a first bit line application voltage terminal among the bit line application voltage terminal group, a second gate which selects a second bit line application voltage terminal among the bit line application voltage terminal group, a third gate provided between the first gate and the first bit line application voltage terminal, a fourth gate provided between the second gate and the second bit line application voltage terminal, and a fifth gate which selects a third bit line application voltage terminal among the bit line application voltage terminal group, the first data cache circuit has a positive-phase input/output terminal and reversed-phase input/output terminal, the first gate is controlled by potential of the positive-phase input/output terminal, the second gate is controlled by potential of the reversed-phase input/output terminal, the second data cache circuit includes a gate wiring which holds data and a gate circuit which is connected between one end of the gate wiring and the positive-phase input/output terminal and controls a conduction state of a path between the gate wiring and the positive-phase input/output terminal, the third and fourth gates are controlled by potential of the gate wiring, and the fifth gate is controlled by potential having a reversed phase with respect to the potential of the gate wiring.

12. The device according to claim 11, wherein the first data cache circuit is a static data cache and the second data cache circuit is a dynamic data cache.

13. The device according to claim 2, wherein the selection circuit includes a first gate which selects a first bit line application voltage terminal among the bit line application voltage terminal group, a second gate which selects a second bit line application voltage terminal among the bit line application voltage terminal group, a third gate provided between the first gate and the first bit line application voltage terminal, a fourth gate provided between the second gate and the second bit line application voltage terminal, and a fifth gate which selects a third bit line application voltage terminal among the bit line application voltage terminal group, the first data cache circuit has a positive-phase input/output terminal and reversed-phase input/output terminal, the first gate is controlled by potential of the positive-phase input/output terminal, the second gate is controlled by potential of the reversed-phase input/output terminal, the second data cache circuit includes a gate wiring which holds data and a gate circuit which is connected between one end of the gate wiring and the positive-phase input/output terminal and controls a conduction state of a path between the gate wiring and the positive-phase input/output terminal, the third and fourth gates are controlled by potential of the gate wiring, and the fifth gate is controlled by potential having a reversed phase with respect to the potential of the gate wiring.

14. The device according to claim 13, wherein the first data cache circuit is a static data cache and the second data cache circuit is a dynamic data cache.

15. The device according to claim 2, wherein voltages of the bit line application voltage terminal group correspond to a state in which a degree of strength of programming the memory cell is divided by stages.

16. The device according to claim 1, wherein the selection circuit includes a first gate which selects a first bit line application voltage terminal among the bit line application voltage terminal group, a second gate which selects a second bit line application voltage terminal among the bit line application voltage terminal group, a third gate provided between the first gate and the first bit line application voltage terminal, a fourth gate provided between the second gate and the second bit line application voltage terminal, and a fifth gate which selects a third bit line application voltage terminal among the bit line application voltage terminal group, the first data cache circuit has a positive-phase input/output terminal and reversed-phase input/output terminal, the first gate is controlled by potential of the positive-phase input/output terminal, the second gate is controlled by potential of the reversed-phase input/output terminal, the second data cache circuit includes a gate wiring which holds data and a gate circuit which is connected between one end of the gate wiring and the positive-phase input/output terminal and controls a conduction state of a path between the gate wiring and the positive-phase input/output terminal, the third and fourth gates are controlled by potential of the gate wiring, and the fifth gate is controlled by potential having a reversed phase with respect to the potential of the gate wiring.

17. The device according to claim 16, wherein the first data cache circuit is a static data cache and the second data cache circuit is a dynamic data cache.

18. The device according to claim 1, wherein voltages of the bit line application voltage terminal group correspond to a state in which a degree of strength of programming the memory cell is divided by stages.

19. A semiconductor integrated circuit device comprising:
    a bit line to which a memory cell is connected;
    a group of bit line application voltage terminals to which different voltages are applied; and
    a data circuit configured to hold program data to be programmed into the memory cell and change data to be held according to a verify result from the memory cell, the data circuit is further configured to select one of the bit line application voltage terminals based on the data held therein and apply a voltage to the selected bit line application voltage terminal to the bit line,
wherein voltages of the bit line application voltage terminal group correspond to a state in which a degree of strength of programming the memory cell is divided by stages.

* * * * *